United States Patent [19]
Arai

[11] Patent Number: 4,905,191
[45] Date of Patent: Feb. 27, 1990

[54] MICROCOMPUTER WITH BUILT-IN EPROM AND TEST MODE

[75] Inventor: Masahiko Arai, Kodaira, Japan

[73] Assignee: Hitachi Ltd., Tokyo, Japan

[21] Appl. No.: 132,996

[22] Filed: Dec. 15, 1987

[30] Foreign Application Priority Data

Jan. 16, 1987 [JP] Japan .................................. 62-5959

[51] Int. Cl.⁴ ..................... G11C 7/00; G11C 17/00; G11C 29/00
[52] U.S. Cl. .................................. 371/21.2; 365/201; 365/94
[58] Field of Search ................. 365/94, 104, 189, 201; 371/16–18, 21, 189.01, 189.03

[56] References Cited

U.S. PATENT DOCUMENTS 4,703,453 10/1987 Shinoda et al. ..................... 365/104
4,719,599 1/1988 Natsui et al. ......................... 365/201
4,731,760 3/1988 Maini .................................. 365/201

OTHER PUBLICATIONS

"Hitachi Microcomputer System ZTAT Microcomputer HD63701X0 Users Manual", Hitachi 68-1-135 (Translation and Original Japanese Version Enclosed).

Primary Examiner—Stuart N. Hecker
Assistant Examiner—Alyssa H. Bowler
Attorney, Agent, or Firm—Fay, Sharpe, Beall, Fagan, Minnich & McKee

[57] ABSTRACT

A single-chip microcomputer comprising a microprocessor which executes information processing in accordance with a predetermined program, and an EPROM which stores the program therein, the EPROM including word line selection means having a plurality of word lines coupled thereto, one of the word lines being brought into a selected state on the basis of a plurality of address signals, and control means for bringing a dummy word line different from the plurality of word lines into a selected state and all of the plurality of word lines into unselected states.

9 Claims, 6 Drawing Sheets

MICROCOMPUTER WITH BUILT-IN EPROM AND TEST MODE

BACKGROUND OF THE INVENTION

This invention relates to a semiconductor integrated circuit device. More particularly, it relates to a technique which is effective when applied to, for example, a microcomputer of single chip wherein a ROM (read only memory) to store a program for information processing is constructed of an EPROM.

In a microcomputer of single chip, predetermined information processing is carried out in accordance with a program written in a built-in ROM. The Applicant of the present application has formerly developed a single-chip microcomputer which employs an EPROM (electrically programmable read only memory) as the built-in ROM. By employing the EPROM in this manner, a single-chip microcomputer having an information processing function which a user desires can be promptly offered, and the mass-producibility of the microcomputers can be enhanced. In contrast, when a mask type ROM is employed as the built-in ROM, time is expended on the manufacture of various masks for writing the program thereof and the manufacture of an integrated circuit with the masks. The single-chip microcomputer with the built-in EPROM is described in, for example, "USERS MANUAL OF ZTAT MICROCOMPUTER HD63701X0" issued in Oct. 1985 by Hitachi, Ltd., pp. 40–42.

The EPROM built in the single-chip microcomputer as stated above is equivalently handled just as the mask type ROM, so that the erasing operation thereof is made impossible. As regards a semiconductor integrated circuit device, when a circuit is finished up on a semiconductor wafer, its function tests including write/read test are conducted by probing, and only nondefective units are subjected to the subsequent step of assemblage. At this step of assemblage, however, any defect might arise. Nevertheless, after the completion of the product, the EPROM is not erasable as described above, so that a write test cannot be conducted for the EPROM. Therefore, defective units might be shipped, and a problem is left in reliability.

SUMMARY OF THE INVENTION

An object of this invention is to provide a semiconductor integrated circuit device which improves the reliability of a built-in EPROM circuit rendered unerasable.

The aforementioned and other objects and novel features of this invention will become apparent from the description of the specification and the accompanying drawings.

A typical aspect of performance of this invention will be briefly summarized below:

An EPROM to be rendered unerasable is formed with a storage area for a write test as configured of dummy storage elements, and a memory access thereto is permitted on the basis of a control signal supplied from a specified external terminal.

According to the above expedient, data can be written into the dummy storage elements, so that circuit functions concerning the data lines or word lines of the EPROM and a selection circuit therefor to be used by a user can be tested.

DESCRIPTION OF THE PREFERRED EMBODIMENTS

Figure 1:
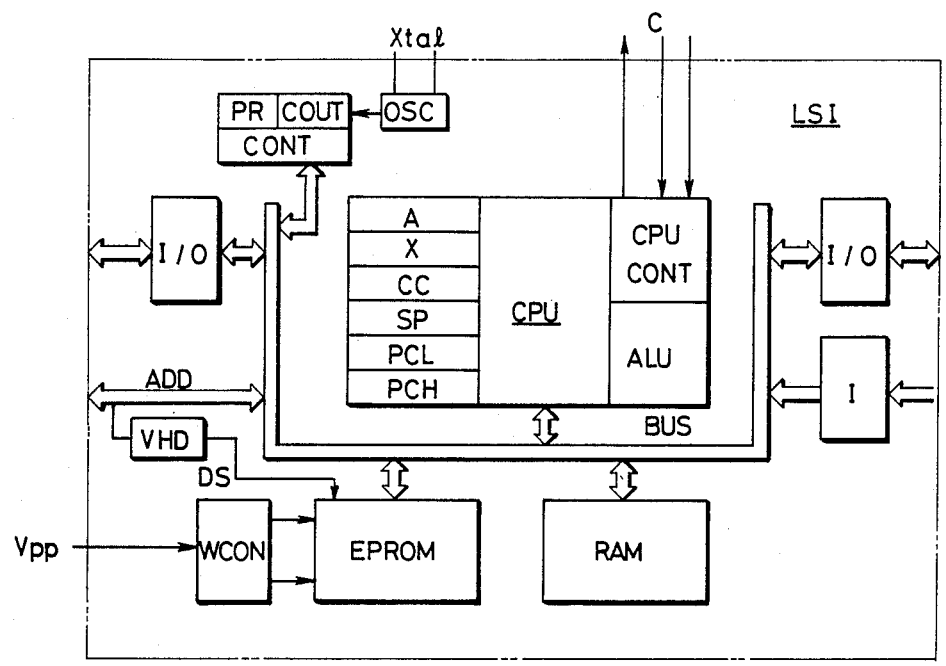
FIG. 1 is a block diagram showing an embodiment of a single-chip microcomputer to which this invention is applied.

Shown in FIG. 1 is a block diagram of an embodiment of a single-chip microcomputer to which this invention is applied.

Referring to the figure, a portion enclosed with a broken line is an integrated circuit LSI. Various circuit blocks formed here construct the single-chip microcomputer as a whole, and they are fabricated on a single semiconductor substrate of, e.g., silicon by known manufacturing techniques for semiconductor integrated circuits.

Symbol CPU indicates a microprocessor, the principal constituent blocks of which are typically exemplified.

Symbol A denotes an accumulator, symbol X an index register, symbol CC a condition code register, symbol SP a stack pointer, symbols PCH and PCL program counters, symbol CPU-CONT a CPU controller, and symbol ALU an arithmetic-logic unit.

The architecture of such a microprocessor CPU is known from, for example, Mitsuharu Yada: "FUNDAMENTALS OF MICROCOMPUTER" issued on Apr. 10, 1978 by Kabushiki-Kaisha Ohm-sha, and shall not be described in detail.

Symbols I/O denotes an input/output port, in which a data transfer direction register is included. In addition, symbol I denotes an input-only port.

Symbol OSC represents an oscillator circuit. Though not especially restricted, it forms a reference frequency signal of high precision using a crystal oscillator Xtal which is externally mounted. Clock pulses required for the microprocessor CPU are formed on the basis of this reference frequency signal. In addition, the reference frequency signal is utilized as the reference time pulses of a timer. This timer is constructed of a counter COUT, a prescaler PR and a controller CONT.

Shown by symbol RAM is a random access memory, which is mainly used as a circuit for storing temporary data.

Shown by symbol EPROM is an electrically programmable read only memory, in which programs for various information processing are written.

The circuit blocks stated above are interconnected by a bus BUS around the microprocessor CPU. This bus BUS includes data buses and address buses ADD. In the bus BUS, the address buses ADD are coupled to external terminals for a write operation for the EPROM, and so forth.

Figure 3:
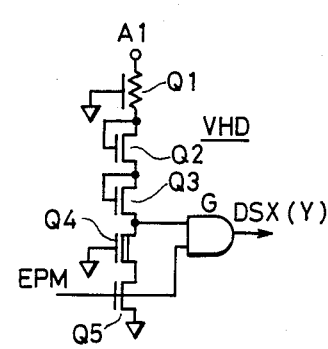
FIG. 3 is a circuit diagram showing an embodiment of a high voltage detector circuit in the microcomputer.

Since, in the microcomputer of this embodiment, the EPROM is employed, a control circuit WCON for the writing etc. thereof is provided Though not especially restricted, this control circuit WCON identifies the level of a voltage fed from an external terminal $V_{pp}$, to control write/read operation modes or to supply the EPROM with the writing high voltage thereof. By way of example, when the control circuit WCON is fed with a comparatively low voltage (5 V) such as internal power source voltage $V_{cc}$ or the ground potential of the circuitry from the external terminal $V_{pp}$, an identification signal of low level is formed by a voltage level detector circuit built therein. This signal at the low level is utilized for, e.g., establishing the read operation mode when the EPROM has been selected by the CPU. On the other hand, when the control circuit WCON is fed with the high voltage (for example, about 12 V) for the writing of the EPROM from the external terminal $V_{pp}$, an identification signal of high level is formed by the voltage level detector circuit. This signal at the high level serves, e.g., to bring the data input buffer of the EPROM into an operating state and to process and form a writing high level signal of logic "0" by the use of the high voltage $V_{pp}$ and in accordance with information supplied from the data bus, the logic "0" being written into a selected memory cell (nonvolatile storage element of stacked gate structure having a control gate and a floating gate). On this occasion, the EPROM is directly supplied with address signals from outside. Incidentally, the voltage level detector circuit is realized by a circuit as shown in FIG. 3 to be referred to later.

By way of example, the integrated circuit LSI of this embodiment is entirely encapsulated with a plastics package or the like. Accordingly, the built-in EPROM is incapable of the erasing operation after the packaging.

Figure 2:
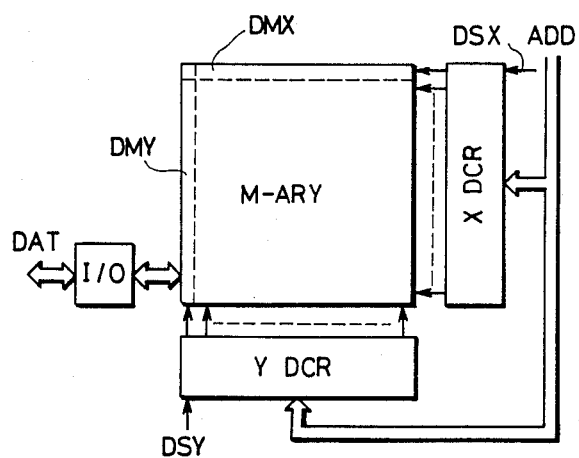
FIG. 2 is a block diagram showing an embodiment of an EPROM in the microcomputer.

Shown in FIG. 2 is a schematic block diagram of an embodiment of the EPROM.

A memory array M-ARY is so constructed that the nonvolatile storage elements made up of MOSFET's of the stacked gate structure are arranged in a matrix arrayal. The control gates of these storage elements are coupled to corresponding word lines, while the drain electrodes thereof are coupled to corresponding bit lines (or data lines). In this embodiment, as indicated by dotted lines in the figure, dummy storage areas which are used for a write test after the completion of the product are defined at parts (DMX, DMY) of the memory array M-ARY. The word lines of the memory array M-ARY are also connected to the control gates of dummy storage elements arranged in the dummy storage area DMY. A dummy bit line is laid in this dummy storage area DMY. The data lines of the memory array M-ARY are also connected to the drain electrodes of dummy storage elements arranged in the dummy storage area DMX. A dummy word line is laid in this dummy storage area DMX.

The word lines of the memory array M-ARY and the dummy word line of the dummy storage area DMX are selected by an X-address decoder XDCR. Here, the dummy word line is brought into a selected state when a signal DSX to be explained later has been formed. When set at its selective level, this signal DSX brings all the word lines of the memory array M-ARY into unselected states. The bit lines (or data lines) of the memory array M-ARY and the dummy bit line of the dummay storage area DMY are selected by a Y-address decoder YDCR. Here, the dummy bit line is brought into a selected state when a signal DSY to be explained later has been formed. When set at its selective level, this signal DSY brings all the bit lines of the memory array M-ARY into unselected states. The selection of the bit line or the dummy bit line is effected in such a way that the bit line and a common bit line are connected by a column switch MOSFET which is turned 'on' by a selection signal formed by the Y-address decoder YDCR. Each of the address decoders XDCR and YDCR has the latch function of receiving an address signal fed from the address bus ADD and holding this signal, and it decodes the held address signal and forms the selection signal of the memory cell.

Each of the signals DSX and DSY is formed by, for example, a circuit which operates to detect a high voltage when a specified address signal supplied from outside has been set at the high voltage of, e.g., about 12 V, as will be described later with reference to FIG. 3. Thus, the dummy storage areas DMX and DMY are not included in an address space viewed from the microprocessor CPU. In addition, some of the storage bits of the dummy storage areas DMX and DMY can be utilized as the storage areas of the code of the product and code information indicative of the history of the product.

The common data line is connected to a data bus DAT through an input/output circuit I/O. By way of example, in the read operation as described above, the output circuit falls into an operating state and transmits the signal of the common data signal to the data bus DAT. Besides, in the write operation, the input circuit is brought into an operating state by the aforementioned control signal, and the signal of the data bus subject to the logic "0" has its level converted by utilizing the high voltage $V_{pp}$ and is transmitted to the common data line.

Shown in FIG. 3 is a circuit diagram of an embodiment of the high voltage detector circuit which forms the selection signal DSX (DSY) of the dummy word line (dummy bit line) for use in the write test.

The specified address terminal Ai is connected to the source of a P-channel type MOSFET Q1. By way of example, this MOSFET Q1 has its source, drain and channel regions formed by utilizing a polycrystalline silicon layer which is formed on a field oxide film on the semiconductor substrate. More specifically, the parts of the polycrystalline silicon layer sandwiching the part thereof to become the channel region are doped with a P+-type impurity at a comparatively high concentration, thereby to form the source and drain regions. On the channel region between the source and the drain, a gate electrode is formed through a gate insulator film which is thin. Thus, the MOSFET Q1 is constructed. The gate electrode is steadily connected to the ground potential point of the circuitry. It is also allowed to form a well region under the field oxide film and to supply the well region with the same ground potential of the circuitry as that of the gate electrode. Thus, a voltage fed from the address terminal Ai is supplied across the gate and source of the MOSFET Q1. As described above, the MOSFET Q1 for detecting the high voltage is constructed by utilizing the polycrystalline silicon layer formed on the insulator film. Therefore, even when the high voltage above the power source voltage $V_{cc}$ as stated above is supplied, a CMOS integrated circuit is free from the fear of latch-up because it is electrically isolated from the semiconductor substrate and the well region.

The drain of the MOSFET Q1 is provided with N-channel MOSFET's Q2 and Q3 in diode connection though this is not especially restrictive. These MOSFET's Q2 and Q3 are MOSFET's for shifting a level, by which a decision level based on the threshold voltage of the MOSFET Q1, e.g., about 8 V is raised to a decision level of, e.g., about 10 V. A depletion-Mode MOSFET Q4 serving as load means for the MOSFET Q1 is connected to the MOSFET Q3. This MOSFET Q4 has its gate steadily supplied with the ground potential of the circuitry, thereby to operate as a resistance element. In order to prevent a leakage current from arising in the series circuit consisting of the MOSFET's Q1-Q4, a switch MOSFET Q5 of the N-channel type is interposed between the MOSFET Q4 and the ground potential of the circuitry. The gate of this MOSFET Q5 is supplied with the operation mode signal of the EPROM. As compared with the MOSFET Q4, the MOSFET Q5 has its conductance set to be higher.

A voltage detection signal is provided from the node between the MOSFET's Q4 and Q3. The output signal DSX (Y) of the gate circuit G forms the selection signal of the dummy storage area DMX (DMY).

A voltage detector circuit similar to the above, which receives a high voltage from any of other address terminals not shown is disposed in correspondence with the dummy storage area DMY, whereby the signal DSY is formed. In addition, a voltage detector circuit similar to the above is utilized for the writing high voltage $V_{pp}$. In this case, the similar voltage detector circuit is connected to the terminal $V_{pp}$ in place of the address terminal Ai as stated above.

The operation of level decision in the circuit of this embodiment proceeds as follows:

In the operation mode state of the EPROM, the operation mode signal EPM is rendered a high level. Thus, the MOSFET Q5 is turned "on." When, under such an operating state of the EPROM, the external terminal Ai is set at the high voltage of about 12 V above the power source voltage of, e.g., about 5 V, the MOSFET Q1 is turned "on." Thus, the output signal which is derived from the drain of the MOSFET Q4 is made a voltage higher than the logic threshold voltage of the AND gate circuit G in accordance with the conductance ratio between the MOSFET Q4 and the MOSFET Q1. Then, the output signal DSX (Y) of the AND gate circuit G is set at a high level, and the dummy word line of the dummy storage area DMX is brought into the selected state. On this occasion, all the word lines of the memory array M-ARY are brought into the unselected states by the signal DSX. Thus, when the write mode is instructed to the EPROM, data can be written into the dummy storage elements coupled to the dummy word line. By a read operation subsequent to the writing, whether the data lines and the write circuit of the column (Y) group, namely, the address decoder YDCR, write amplifiers, etc. can be decided nondefective or defective.

On the other hand, the signal DSY is generated by the similar circuit. Thus, the dummy data line of the dummy storage area DMY is brought into the selected state. On this occasion, all the data lines of the memory array M-ARY are brought into the unselected states by the signal DSY. Accordingly, when the write mode is instructed to the EPROM, data can be written into the dummy storage elements coupled to the dummy data line. By a read operation subsequent to the writing, whether the write circuit of the row (X) group, namely, the address decoder XDCR, the word lines, etc. can be decided nondefective or defective.

In the write tests of the dummy storage areas DMX and DMY, information items for storing a product code, a product history, etc. are written into specified bits though this signifies no special restriction.

If the external terminal Ai is at a low level such as the comparatively low potential of the power source voltage $V_{cc}$ or the ground potential of the circuitry, the MOSFET Q1 is held in the "off" state. Thus, the drain potential of the MOSFET Q4 is set at a low level of, e.g., the ground potential of the circuitry. Then, the output signal DSX (Y) of the AND gate circuit G is set at a low level. In this case, accordingly, the dummy storage area DMX (DMY) is brought into an unselected state, and the operation therefor is replaced with a write or read operation for the memory array M-ARY.

In the operation mode state of the microcomputer side, the control signal EPM is set at a low level. The MOSFET Q5 is responsively turned "off." Accordingly, the occurrence of any input leakage current to flow to the external terminal Ai can be prevented irrespective of the voltage supplied to the external terminal Ai and the process dispersion of the MOSFET Q1. In consequence, even when the maximum allowable voltage is fed to the external terminal Ai with the control signal EPM set at the low level, any leakage current does not appear. This holds true also of the voltage detector circuit which detects the presence of the supply of the writing high voltage $V_{pp}$.

Figure 4:
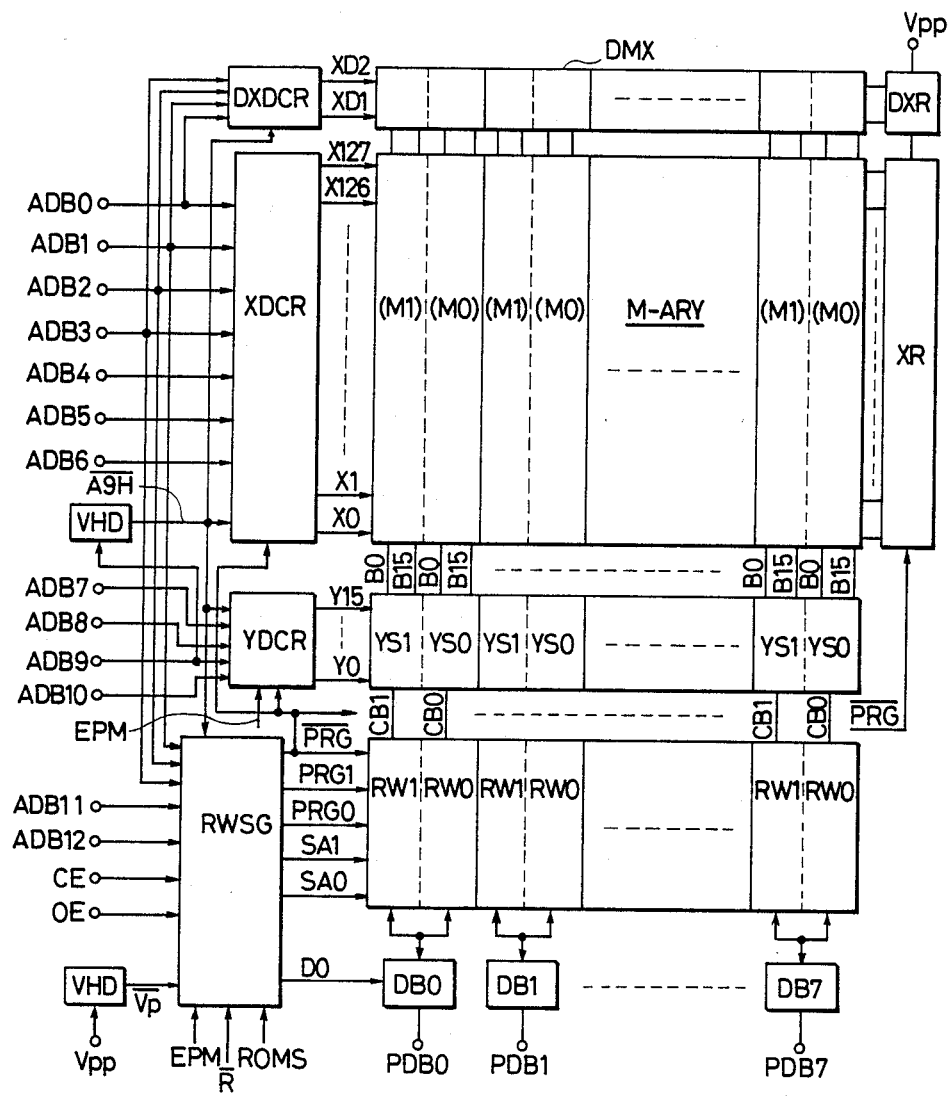
FIG. 4 is a block diagram showing a detailed embodiment of the EPROM.

FIG. 4 shows a block diagram of a practicable embodiment of the EPROM.

Though not especially restricted, the memory array M-ARY of this embodiment has 8 memory mats in which bit lines (also called "data lines" or "digit lines") are divied in 8 as a whole. As indicated by dotted lines in the figure, each of the memory mats is divied into 2 memory areas M1 and M0. Each of the memory areas M1 and M0 has 16 bit lines B0-B15. In addition, the memory array M-ARY has 128 word lines. Storage elements of the stacked gate structure to be described later are arranged at the intersection points between the respective bit lines and word lines, so that the memory array M-ARY has a storage capacity of $128 \times 16 \times 2 \times 8 = 32768$ bits. The 8 memory mats are respectively furnished with data input/output circuits DB0-DB7 to be described later, and a write/read operation in 8-bit unit is performed. Therefore, the EPROM of this embodiment has a storage capacity of 4096 bytes in 8-bit unit (8 bits = 1 byte).

In this embodiment, a dummy array DMX is provided separately from the memory array M-ARY described above. Though not especially restricted, this dummy array DMX has 2 word lines. In correspondence with these dummy word lines, the bit lines are extended so as to intersect them, so that the dummy array DMX has a storage capacity of $2 \times 2 \times 16 \times 8 = 512$ bits.

An X-address decoder XDCR decodes address signals ADB0-ADB6 composed of 7 bits, and forms selection signals X0-X127 corresponding to the 128 word lines. The X-address decoder XDCR is supplied with a high voltage detection signal $\overline{\text{A9H}}$ formed by the high voltage detector circuit VHD as shown in FIG. 3, besides the address signals ADB0-ADB6 mentioned above. Since the high voltage detector circuit VHD is provided with an inverter circuit at the output part thereof, it sets its detection signal at a low level such as the ground potential of the circuitry when an address signal ADB9 is rendered a level above the high level of the ordinary address signal, e.g., about 12 V. In addition, if the address signal ADB9 is at a low level such as the ground potential of the circuitry or a high level of, e.g., about 5 V, the high voltage detector circuit VHD sets the detection signal $\overline{\text{A9H}}$ at a high voltage of, e.g., about 5 V. When the detection signal is set at the low level, the X-address decoder XDCR renders all the outputs X0-X127 unselected irrespective of the address signals ADB0-ADB6.

A dummy decoder DXDCR forms selection signals XD1 and XD2 which correspond to the 2 word lines laid in the dummy array DMX. Though not especially restricted, the dummy decoder DXDCR receives the address signals ADB0-ADB3 and the high voltage detection signal $\overline{\text{A9H}}$ and selects either dummy word line designated by the address signals ADB0-ADB3 when the detection signal $\overline{\text{A9H}}$ has been set at the low level.

The word lines of the memory array M-ARY and the dummy array DMX need to have a high selective level of, e.g., about 12 V for writing data into the nonvolatile storage elements, and a low selective level of, e.g., about 5 V for reading data therefrom. In order to perform level conversions corresponding to such operation modes, the word lines of the memory array and those of the dummy array are respectively provided with high voltage load circuits XR and DXR.

Each of column selection circuits YS1 and YS0 selects one of the bit lines B0-B15 in the corresponding memory area M1 or M0 and couples the selected bit line to a common bit line CB1 or CB0.

A Y-address decoder YDCR decodes address signals ADB7-ADB10, and forms selection signals Y0-Y15 corresponding to the bit lines B0-B15. The selection signals Y0-Y15 are supplied to all the column selection circuits in common. Though no illustration is made, write signals of high level need to be transmitted in write operations for the bit lines for the purpose of writing data into the stacked-gate MOSFET's. Therefore, also the selection signals Y0-Y15 need to be set at a corresponding high selective level in the write operations and are provided with a high voltage load circuit as stated above, not shown. This will be described in detail later. Besides, the Y-address decoder YDCR is supplied with a signal EPM, the high voltage detection signal $\overline{\text{A9H}}$ and a control signal $\overline{\text{PRG}}$.

The common bit lines CB1, CB0 corresponding to the column selection circuits YS1, YS0 are coupled to read/write circuits RW1, RW0, respectively. Each of the read/write circuits RW1, RW0 includes a write amplifier, a sense amplifier for reading, and a selection circuit therefor. The single data input/output circuit DB0 is disposed for the pair of read/write circuits RW1, RW0 in common. In other words, the data input/output circuits DB0 thru DB7 are respectively disposed in correspondence with the divided memory mats. The data input/output circuits DB0-DB7 transfer data to and from data terminals PDB0-PDB7, respectively.

A read/write signal generator circuit RWSG forms control signals $\overline{\text{PRG}}$, PRG1, PRG0, SA1, SA0 and DO for instructing operation modes to the read/write circuits RW1, RW0 and the data input/output circuits. The read/write signal generator circuit RWSG receives address signals ADB11, ADB12, a chip enable signal CE, an output enable signal OE and a high voltage detection signal $\overline{V_p}$ and identifies the operation modes, thereby to form the control signals mentioned above. The high voltage detection signal $\overline{V_p}$ is formed by a high voltage detector circuit VHD as shown in FIG. 3, and it is set at a low level when a program voltage of, e.g., about 12 V has been supplied to a terminal $V_{pp}$. Therefore, the circuit in FIG. 3 is additionally provided with an inverter circuit on the output side thereof.

Figure 5:
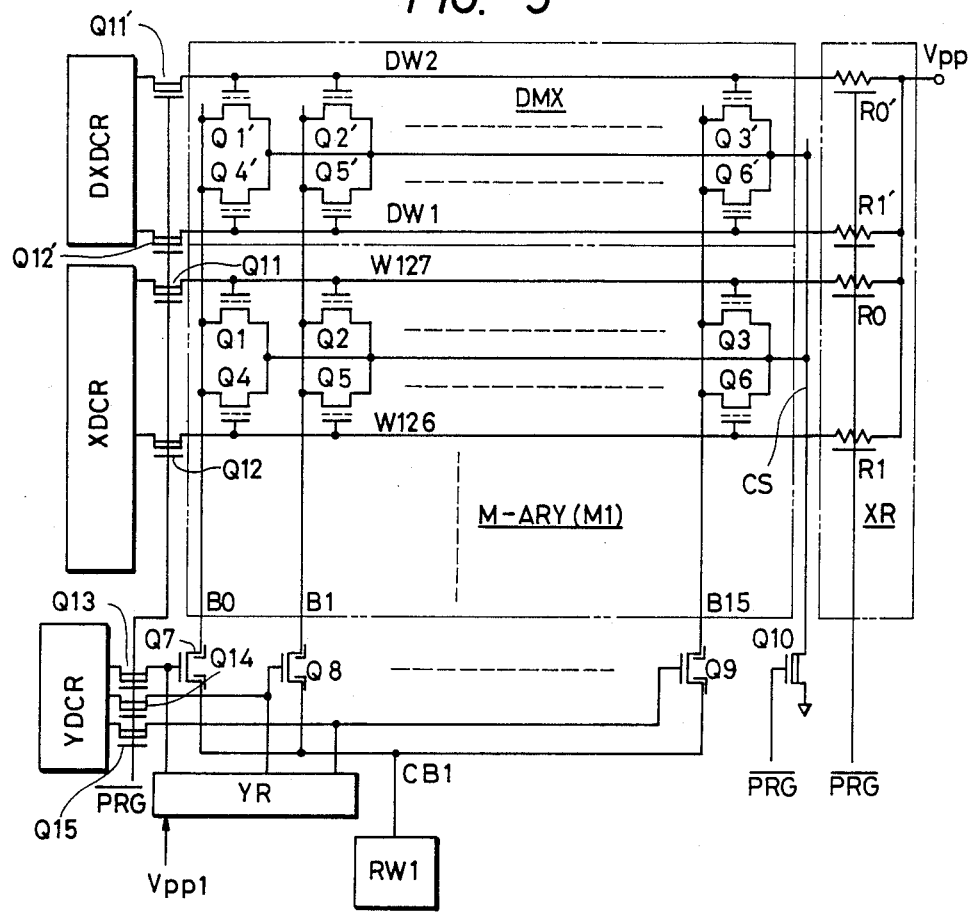
FIG. 5 is a circuit diagram showing an embodiment of one memory area M1 as well as dummy array and peripheral circuits corresponding thereto.

FIG. 5 shows a circuit diagram of an embodiment of one M1 of the memory areas, the dummy array, and the peripheral circuits corresponding thereto. It is to be understood that, in the figure, some of circuit symbols assigned to MOSFET's are the same as in FIG. 3, but that the MOSFET's are circuit elements different from those in FIG. 3.

The memory area M1 illustrated by way of example is configured of transistors of stacked gate structure having a control gate and a floating gate (nonvolatile memory elements: MOSFET's Q1-Q6), word lines W127, W126 and bit lines B0, B1-B15. In the memory area M1, the control gates of the stacked-gate transistors Q1-Q3 (Q4-Q6) arranged in the same row are connected to the corresponding word line W127 (W126), while the drains of the stacked-gate transistors Q1, Q4; Q2, Q5; and Q3, Q6 arranged in the same columns are respectively connected to the corresponding bit lines B0, B1, and B15.

Though not especially restricted, the common source line CS of the stacked-gate transistors is grounded through a depletion-mode MOSFET Q10 which receives the write control signal $\overline{\text{PRG}}$. The MOSFET Q10 is disposed for the following reason: In case of writing data into a memory cell, for example, the memory cell Q1, a high voltage at a writing level is applied to the word line W127, and a high voltage or a low voltage of substantially 0 V conforming to the data to be written is applied to the bit line B0. In this case, when the bit line B0 is set at the high potential, the floating gate of an unselective memory cell, such as the memory cell Q4, coupled to the selected bit line B0 has its potential raised undesirably in accordance with the set high potential due to electrostatic coupling which arises between this floating gate and the bit line B0. As a result, the memory cell, such as the memory cell Q4, which ought to be maintained in its "off" state because of being unselective is rendered conductive undesirably. That is, a leakage current flows to the memory cell which ought not to be selected. In consequence, a write current to flow to the memory cell Q1 which ought to be selected decreases. The illustrated MOSFET Q10 has its conductance rendered compratively low by the low level of the control signal $\overline{\text{PRG}}$ in the write mode. Thus, the potential of the common source line CS which is developed by the write current caused to flow in the write mode is brought to a comparatively high potential by the comparatively low conductance of the MOSFET Q10. When the potential of the common source line CS is comparatively high, the stacked-gate transistor has its threshold voltage rendered comparatively high by the substrate effect.

In this manner, the effective threshold voltage of the stacked-gate transistor which ought not to be selected is heightened, with the result that the leakage current which flows to the unselective stacked-ate transistor can be lessened. Since the write current formed by the writing high voltage is efficiently supplied to the selected stacked-gate transistor, an efficient write operation can be performed. Meanwhile, in the read operation, the conductance of the MOSFET Q10 is rendered comparatively high by the high level of the control signal $\overline{PRG}$. Thus, current to flow to the stacked-gate transistor with logic "1" written therein, the threshold voltage of which has been rendered low owing to no charge injection into the floating gate, can be increased, so that the read speed of the transistor can be raised.

Though not especially restricted, the dummy array DMX corresponding to the bit lines B0-B15 is also provided with MOSFET's Q1'-Q6' of the stacked gate structure similar to the foregoing. By the way, in an arrangement to be described later in which the bit line B15 on the side of the memory area M0, not shown, is selected by the low level of the high voltage detection signal $\overline{A9H}$ and irrespective of the other address signals, the MOSFET's of the stacked gate structure are disposed only in correspondence with the bit line B15 of the memory area M0.

An X-address decoder XDCR forms selection signals to be supplied to the word lines of the memory area M1 (true also of the other memory areas not shown), in accordance with the address signals fed thereto. Though not especially restricted, the X-address decoder XDCR is operated by a power source voltage of +5 V. Therefore, the address decoder XDCR forms the selection signals based on 5 volts. In this regard, the levels of selection signals required in the memory area M1 (the memory array M-ARY) are, for example, a high level substantially equal to 5 V and a low level substantially equal to 0 V in the read operation, and a high level substantially equal to the writing high voltage $V_{pp}$ and a low level substantially equal to 0 V in the write operation. In order to bring the word lines of the memory array M-ARY to the respectively required levels in response to the 5 V-based selection signals delivered from the X-address decoder XDCR, depletion-mode MOSFET's Q11 thru Q12 are interposed between the output terminals of the X-address decoder XDCR and the individual word lines of the memory array, and a writing high-voltage load circuit XR is interposed between the word lines and a writing voltage terminal $V_{pp}$. The writing high-voltage load circuit XR includes resistors R1, R0 each of which has its source, drain and channel regions formed by utilizing a polycrystalline silicon layer formed on a field oxide film on a semiconductor substrate, likewise to the MOSFET Q1 employed in the high voltage detector circuit VHD as shown in FIG. 3. The MOSFET's functioning as the resistors R1, R0 are supplied with the control signal $\overline{PRG}$ to their gate electrodes. Thus, they operate as the resistor elements of high resistance in the write mode in which the signal $\overline{PRG}$ is rendered the low level, and they are turned "off" in the read mode in which a low voltage of, e.g., 5 V is fed to the terminal $V_{pp}$, because the signal $\overline{PRG}$ is rendered the high level. With this arrangement, in the read mode, direct current is not consumed through the word lines which are rendered unselective through the resistors R0 and R1, and hence, a lower power consumption is attained.

The depletion-mode MOSFET's Q11 thru Q12 are supplied with the internal control signal $\overline{PRG}$ to their gates.

In the read operation, the control signal $\overline{PRG}$ is set at the high level substantially equal to 5 V. In this case, all the MOSFET's Q11 thru Q12 are turned "on" in response to the 5 V-based selection signals delivered from the X-address decoder XDCR. Therefore, the outputs of the X-address decoder XDCR are directly transmitted to the corresponding word lines.

In the write operation, the control signal $\overline{PRG}$ is set at the low level substantially equal to 0 V. On this occasion, the resistors R0, etc. operate as the high-resistance elements in accordance with the low level of the control signal $\overline{PRG}$. By way of example, if among the signals delivered from the X-address decoder XDCR, a selection signal X127 corresponding to the word line W127 is at the high level (selective level) substantially equal to 5 V, the MOSFET Q11 is automatically turned "off" because a voltage applied to its gate is rendered a negative level relative to a voltage applied to its source. Consequently, the word line W127 is brought by the high resistance R0 to the high level which is substantially equal to the level of the writing voltage $V_{pp}$. In contrast, if by way of example, a selection signal X126 corresponding to the word line W126 of the X-address decoder XDCR is at the low level substantially equal to 0 V, the MOSFET Q12 remains in the "on" state. Therefore, the word line W126 is set at the low level substantially equal to 0 V by the address decoder XDCR as the resistance of the resistor R1 is rendered high.

These facts hold true also of a dummy decoder DXDCR corresponding to the dummy array DMX. More specifically, also the dummy word lines DW1, DW2 of the dummy array DMX are supplied with the selection signals of the dummy address decoder DXDCR through depletion-mode MOSFET's Q11', Q12' and are provided with resistance elements R0', R1' similar to the foregoing.

In the arrangement of FIG. 5, a common bit line CB1 is laid for the memory area M1. MOSFET's Q7-Q9 which constitute a column selection circuit YS1 are interposed between the bit lines B0-B15 of the memory area M1 and the common bit line CB1 corresponding to this memory area M1.

A Y-address decoder YDCR forms the selection signals Y0-Y15 for selecting the bit lines B0-B15 of each memory area, in accordance with the address signals fed thereto. Likewise to the X-address decoder XDCR, the Y-address decoder YDCR is operated by a power source voltage based on 5 V. The selection signals delivered from the Y-address decoder YDCR are utilized for the controls of the column selection circuits YS1, etc. Here, the column selection circuits YS1, etc. need to be capable of transmitting the write signal of the write voltage level in the write operation. For the purpose of making it possible to turn "on"/"off" the column switch MOSFET's even with the write voltage signal as described above, depletion-mode MOSFET's Q13-Q15 are arranged between the output terminals of the Y-address decoder YDCR and the gates of the column switch MOSFET's Q7-Q9, namely, column selection lines. The gates of the MOSFET's Q13 thru Q15 are supplied with the control signal $\overline{PRG}$ likewise to those of the MOSFET's Q11 thru Q12. A high voltage load circuit YR similar to the foregoing is interposed between the respective column selection lines and the high voltage terminal $V_{pp}1$ though this is not especially restrictive. The common bit line CB1 is coupled to a read/write circuit RW1 which will be explained later.

Figure 6:
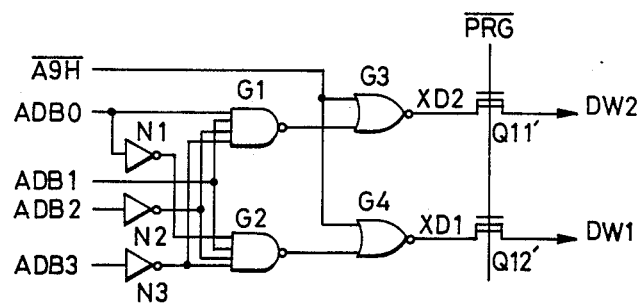
FIG. 6 is a circuit diagram showing an embodiment of dummy address decoder.

FIG. 6 shows a circuit diagram of an embodiment of the dummy address decoder DXDCR.

The address signals ADB0 and ADB1 are directly input to a NAND gate circuit G1. The other address signals ADB2 and ADB3 are respectively inverted by inverter circuits N2 and N3 and then input to the NAND gate circuit G1. Besides, the address signals ADB0, ADB2 and ADB3 are respectively inverted by inverter circuits N1, N2 and N3 and then input to another NAND gate circuit G2. The remaining address signal ADB1 is directly input to the NAND gate circuit G2. Thus, when Address 2 is designated in which the address signals ADB0 and ADB1 are set at a high level with the address signals ADB2 and ADB3 set at a low level, the NAND gate circuit G1 forms a selection signal of low level. In addition, when Address 1 is designated in which the address signals ADB0, ADB2 and ADB3 are set at the low level with the address signal ADB1 set at the high level, the NAND gate circuit G2 forms a selection signal of low level.

The output signals of the NAND gate circuits G1 and G2 are respectively input to NOR gate circuits G3 and G4 in order to be validated when the high voltage detection signal has been set at the low level. The other inputs of these NOR gate circuits G3 and G4 are supplied with the high voltage detection signal $\overline{A9H}$. Therefore, when the signal $\overline{A9H}$ is set at the low level to designate Address 2 or Address 1 mentioned above, the dummy word line-selection signal XD2 or XD1 at the high level is formed.

In the write operation, when the dummy word line-selection signal XD2 is set at the high level, an operation as explained before proceeds in which the depletion-mode MOSFET Q11' is turned "off" in accordance with the control signal $\overline{PRG}$ rendered the low level, whereupon the corresponding dummy word line DW2 is brought to the high level of, e.g., the high voltage $V_{pp}$ by the high voltage load circuit XR. On this occasion, the unselected dummy word line DW1 has the corresponding selection signal XD1 set at the low level thereby to maintain the depletion-mode MOSFET Q12' in the "on" state, so that the low level of, e.g., the ground potential of the circuitry formed by the NOR gate circuit G4 is transmitted to this dummy word line DW1.

In the read operation, when the dummy word line-selection signal XD2 is set at the high level, an operation as explained before proceeds in which the depletion-mode MOSFET Q11' is maintained in the "on" state in accordance with the control signal $\overline{PRG}$ rendered the high level, whereupon the dummy word line DW2 is brought to the high level of, e.g., 5 V. In the ordinary read operation, 5 V or the ground potential of the circuitry is supplied as the high voltage $V_{pp}$, so that the high level as stated above is established without any problem. Even in a read operation during programming, in other words, in a read operation for verifying writing (a verify mode) in the state in which the high voltage of, e.g., about 12 V is supplied to the high voltage terminal $V_{pp}$, the dummy word line DW2 is brought to the high level of, e.g., 5 V in spite of the supplied high voltage $V_{pp}$ mentioned above because the resistor R0' has a high resistance. On this occasion, the unselected dummy word line DW1 has the corresponding selection signal XD1 set at the low level thereby to maintain the depletion-mode MOSFET Q12' in the "on" state similarly to the foregoing, so that this dummy word line DW1 is set at the low level of, e.g., the ground potential of the circuitry formed by the NOR gate circuit G4.

Figure 7:
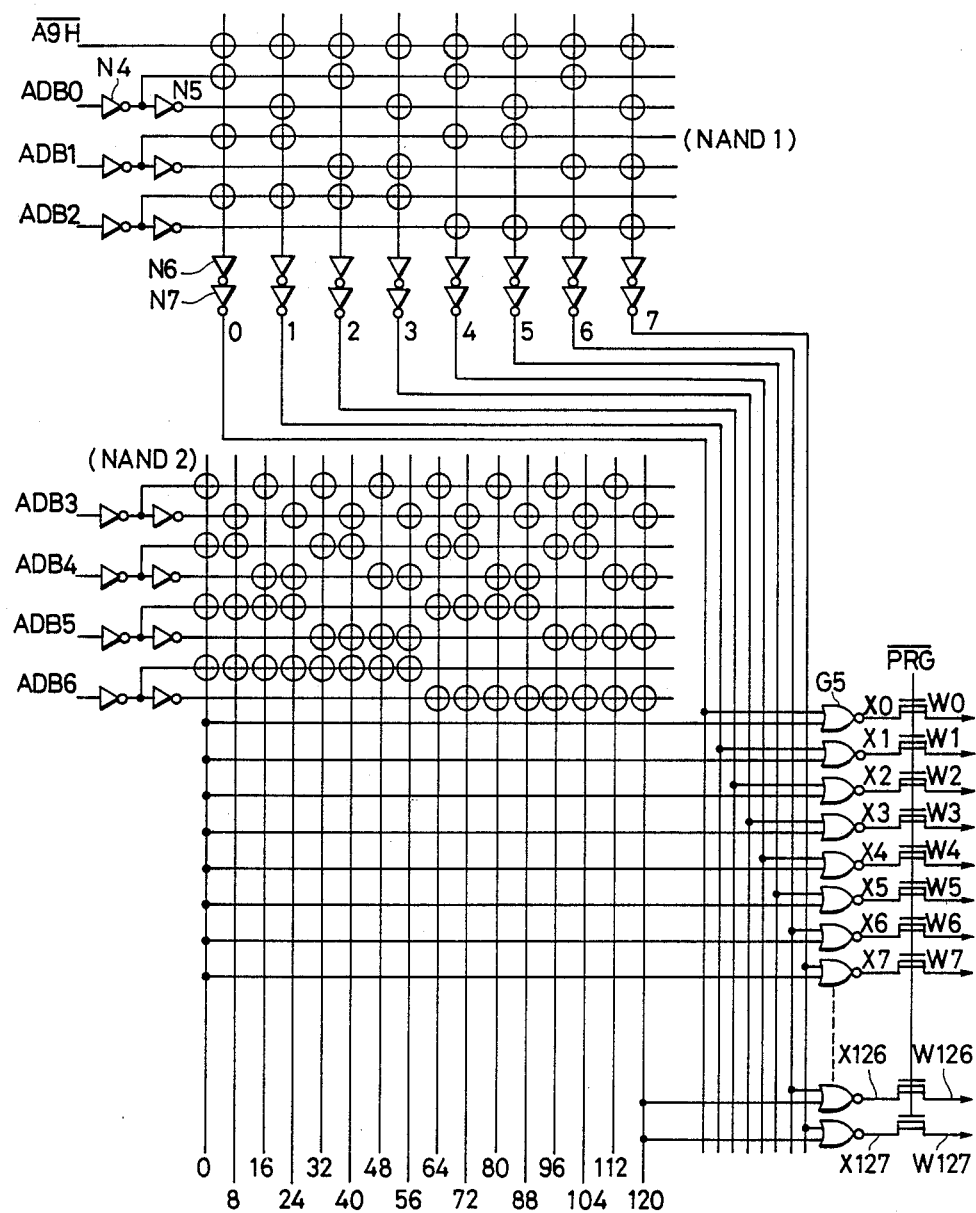
FIG. 7 is a circuit diagram showing an embodiment of an X-address decoder.

FIG. 7 shows a circuit diagram of an embodiment of the X-address decoder XDCR.

In this embodiment, the X-address decoder XDCR is so constructed as to be divided into three decode portions. As exemplified in relation to the address signal ADB0 (the reference symbols of the inverter circuits of the other address signals are omitted), each of the address signals ADB0–ADB2 of three lower bits is converted into an address signal in phase therewith and an address signal of opposite phase thereto by inverter circuits N4 and N5.

Signal lines for the three sets of complementary address signals as stated above are laterally extended as viewed in the figure, and MOSFET's denoted by marks 'o' are disposed at the intersection points between these signal lines and signal lines vertically extended. In other words, as regards the first column, MOSFET's which receive the address signals of opposite phases to the address signals ADB0–ADB2 are connected in serial form. A MOSFET which receives the high voltage detection signal $\overline{A9H}$ is inserted in series with the serial MOSFET's. Such MOSFET's receiving the high voltage detection signal are respectively provided for the serial MOSFET's of the other columns.

Though omitted from the illustration, a load resistor or a precharge MOSFET is provided at the output node of each of the serial MOSFET circuits, in other words, at the input terminal of an inverter circuit N6 exemplified (the reference symbols of the inverter circuits of the other columns are omitted). Thus, when the high voltage detection signal $\overline{A9H}$ is at the high level, eight sorts of decode signals 0–7 corresponding to the three bits of the address signals ADB0–ADB2 are output from output inverter circuits N7 exemplified, etc. The serial MOSFET circuits as stated above constitute a NAND gate circuit (NAND1), which forms the first decode portion.

The address signals ADB3 thru ADB6 of the remaining four higher bits are also converted into complementary address signals by inverter circuits similar to the foregoing, and the converted signals are transmitted to signal lines laterally extended. Likewise to the above, these signal lines are respectively provided with MOSFET's marked 'o' which are serially connected in the vertical direction. Thus, sixteen sorts of decode signals 0–120 are formed. The serial MOSFET circuits as stated above constitute a NAND gate circuit (NAND2), which forms the second decode portion.

The third decode portion is constructed of NOR gate circuits G5 etc. which receive the output signals 0–7 and 0–120 of the two decode portions (NAND1) and (NAND2). That is, each of the NOR gates G5 etc., in effect, constructs an adder circuit for the corresponding two decode signals. By way of example, the NOR gate circuit G5 exemplified receives the decode signal 0 of the first decode portion (NAND1) and the decode signal 0 of the second decode portion (NAND2), thereby to form the selection signal X0 which is brought into the selective state of high level when both the decode signals are at the low level (logic "0"). The NOR gate circuit corresponding to the selection signal X1 receives the decode signal 1 of the first decode portion (NAND1) and the decode signal 0 of the second decode portion (NAND2), thereby to bring this selection signal X1 into the selective state of high level when both the decode signals are at the low level (logic "0"). Thenceforth, the selection signals X2-X127 (the selection signals total 128) are similarly formed on the basis of the combinations of the output signals of the two decode portions (NAND1, NAND2) and by the NOR gate circuits corresponding to the respective selection signals.

In this embodiment, the operation of the X-address decoder circuit XDCR is validated only at the time of memory access to the memory array M-ARY at which the high voltage detection signal $\overline{A9H}$ is rendered the high level. In other words, at the time of access to the dummy array DMX at which the signal $\overline{A9H}$ is rendered the low level, the MOSFET's corresponding to the X-address decoder circuit XDCR are brought into the "off" states by the low level of the signal $\overline{A9H}$. Thus, the first decode portion (NAND1) brings all the decode signals 0-7 into the unselective states of high level irrespective of the address signals ADB0-ADB2 of the three lower bits. Accordingly, the output signals of the NOR gate circuits G5 etc. constituting the third decode portion are brought into the unselective states of low level irrespective of the decode signals 0-120 of the second decode portion (NAND2). Thus, the operation of selecting the word lines of the memory array M-ARY is inhibited at the time of the memory access to the dummy array DMX. Accordingly, as understood from the above explanation and the explanation of the operation in FIG. 6, the select operations of the word lines of the dummy array DMX and the memory array M-ARY are complementarily performed in accordance with the low level/high level of the high voltage detection signal $\overline{A9H}$.

Figure 8:
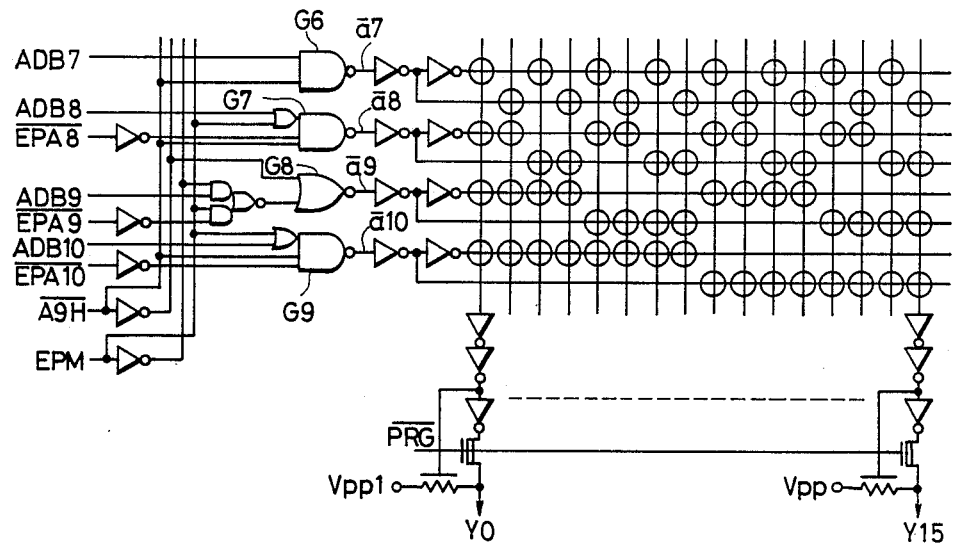
FIG. 8 is a circuit diagram showing an embodiment of a Y-address decoder.

FIG. 8 shows a circuit diagram of an embodiment of the Y-address decoder YDCR.

In this embodiment, logical gate circuits are disposed at the input part of the Y-address decoder. NAND gate circuits G6, G7 and G9 transmit internal address signals $\bar{a}7$, $\bar{a}8$ and $\bar{a}10$ from the outputs thereof, respectively. In addition, a NOR gate circuit G8 transmits an internal address signal $\bar{a}9$ from the output thereof.

The inputs of the NAND gate circuit G6 for forming the internal address signal $\bar{a}7$ are supplied with the address signal ADB7 and the high voltage detection signal $\overline{A9H}$. The inputs of the NAND gate circuit G7 for forming the internal address signal $\bar{a}8$ are supplied with the logical sum output between the address signal ADB8 and the signal EPM, the output signal of an inverter circuit receiving an address signal $\overline{EPA8}$, and the high voltage detection signal $\overline{A9H}$. The inputs of the NOR gate circuit G8 for forming the internal address signal $\bar{a}9$ are supplied with the inverted signal of the high voltage detection signal $\overline{A9H}$ through an inverter circuit, and either of the address signal ADB9 or the output signal of an inverter circuit receiving an address signal $\overline{EPA9}$, selected through a switching gate circuit which is controlled by the signal EPM and the inverted signal thereof. That is, the switching gate circuit is constructed of AND gate circuits which are respectively controlled by the EPM signal and the signal of the opposite phase thereto, and a NOR gate circuit which receives the output signals of the AND gate circuits. The inputs of the NAND gate circuit G9 for forming the internal address signal $\bar{a}10$ are supplied with the logical sum output between the address signal ADB10 and the signal EPM, the output signal of an inverter receiving an address signal $\overline{EPA10}$, and the high voltage detection signal $\overline{A9H}$.

By providing such logical gate circuits, those $\bar{a}8$-$\bar{a}10$ of the substantial Y-address signals $\bar{a}7$-$\bar{a}10$ are set at signals conforming to the address signals EPA8-EPA10 in the EPROM mode in which the signal EPM is rendered the high level, and they are set at signals conforming to the address signals $\overline{ADB8}$-$\overline{ADB10}$ in the microcomputer mode in which the signal EPM is rendered the low level. Then, when the high voltage detection signal $\overline{A9H}$ is rendered the low level, all the address signals $\bar{a}7$-$\bar{a}10$ become the high level, and the selection signal Y15 is brought into the selective state by a decoder circuit to be explained below. In such an arrangement, the selection signal Y15 is automatically designated merely by setting the voltage level of the address signal ADB9 at the high voltage of, e.g., about 12 V as described before. In the dummy array DMX, therefore, the stacked-gate transistors are disposed only at the intersection points between the bit line corresponding to the selection signal Y15 and the dummy word lines DW1, DW2. Besides, in a case where the read/write signal generator circuit RWSG to be described later adopts the scheme of designating the sides of the memory areas M0 in the eight memory mats, the stacked-gate transistors as dummy cells are arrayed in only places corresponding to the bit lines B15 of the memory areas M0.

By adopting such an arrangement, in accessing the dummy array, it is only required to designate the address signals ADB0-ADB3 for designating the dummy word line DW1 or DW2 and to set the address signal ADB9 at the high voltage of, e.g., about 12 V.

In a case where, in lieu of such an arrangement, the code and history of the product as stated before are written into the dummy array DMX, the high voltage detection signal $\overline{A9H}$ is omitted, and any desired bit line can be selected according to the address signals ADB7 thru ADB10 or address signals EPA7 thru EPA10.

As an address decode portion, a NAND gate circuit similar to that of the X-address decoder circuit is utilized. More specifically, each of the internal address signals $\bar{a}7$-$\bar{a}10$ is converted into address signals complementary to each other by two inverter circuits connected in cascade, and the resulting address signals are transmitted to signal lines laterally extended. In the illustration of FIG. 8, MOSFET's denoted by marks "o" are disposed at the intersection points between the lateral signal lines and signal lines vertically extended. In other words, as regards the first column, the MOSFET's which receive the internal address signals $\bar{a}7$-$\bar{a}10$ are connected in serial form. Though not shown in the figure, a load resistor or a precharge MOSFET is provided similarly to the foregoing at the output node of the serial MOSFET circuit, namely, at the input terminal of the first-stage one of cascade-connected inverter circuits which constitute an output circuit. Thus, when all the address signals $\bar{a}7$-$\bar{a}10$ are at the high level, the selection signal Y0 set at the high level is formed. Fundamentally, this applies also to circuits for forming the other selection signals Y1-Y15, except mere differences in the combinations of signals which are supplied to the gates of the MOSFET's connected in serial form.

In this case, as to the selection signal Y0, the column switch MOSFET receiving this signal needs to convert it into a control signal which can transmit the write signal of high level as described before. In this embodiment, therefore, a decode output of the opposite phase to the selection signal Y0 is fed to the gate of a high-resistance resistor made up of a P-channel MOSFET formed by utilizing a polycrystalline silicon layer. That is, the input signal of an inverter circuit for forming the selection signal Y0 to be delivered through a depletion-mode MOSFET is fed to the gate of the MOSFET which constructs the high-resistance element. In this arrangement, the P-channel MOSFET corresponding to the selected bit line is turned "on" to operate as the high-resistance element. Thus, in the write mode in which the control signal $\overline{PRG}$ is rendered the low level, the depletion-mode MOSFET is turned "off," and the selection signal Y0 at the high level conforming to the high voltage $V_{pp}$ applied through the high-resistance element is formed. Since, in the read mode, the control signal $\overline{PRG}$ is rendered the high level, the depletion-mode MOSFET maintains its "on" state, and the 5 V-based signal at the high level is output as the selection signal Y0 without any change.

Figure 9:
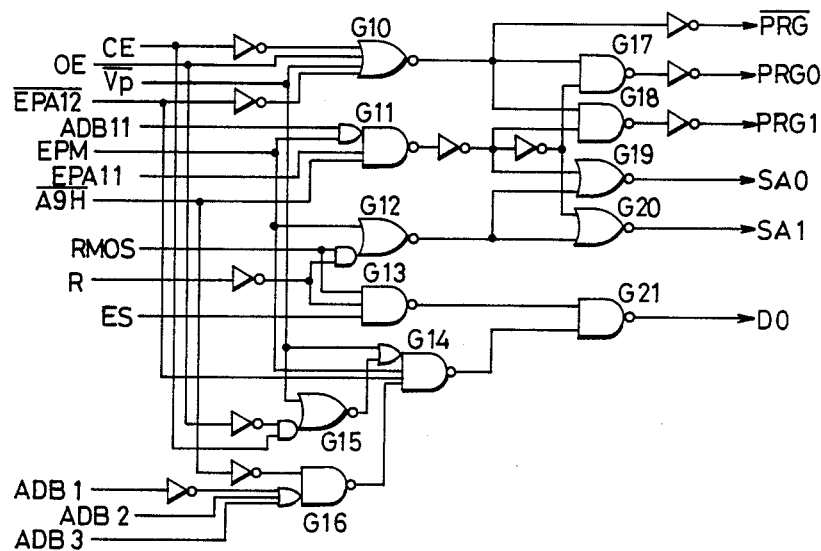
FIG. 9 is a circuit diagram showing an embodiment of a read/write signal generator circuit.

FIG. 9 shows a circuit diagram of an embodiment of the read/write signal generator circuit RWSG.

A NOR gate circuit G10 receives the chip enable signal CE passed through an inverter circuit, the output enable signal OE and the high voltage detection signal $\overline{V_p}$, and also an address signal $\overline{EPA12}$ passed through an inverter circuit, and identifies the program mode. More specifically, when all the aforementioned signals are at the low level, the write mode is identified, and the control signal $\overline{PRG}$ set at the high level is formed through an inverter circuit. In the write mode, the signal CE is set at the high level, the signal OE at the low level, and the signal $V_{pp}$ at the high voltage of about 12 V. In the read mode, the signal CE is set at the low level, and the signal OE at the high level. In the verify mode, the voltage of about 12 V is kept applied to the terminal $V_{pp}$.

A NAND gate circuit G11 receives the logical sum output between the address signal ADB11 and the signal EPM, an address signal EPA11, and the high voltage detection signal $\overline{A9H}$, and forms a signal for designating either of the memory areas M1 and M0 into which each of the eight memory mats is divided. On the basis of the combinations between this output signal and the output signal of the NOR gate circuit G10, NAND gate circuits G17 and G18 form signals PRG0 and PRG1 corresponding to the memory areas M0 and M1, respectively. Here, the signals PRG0 and PRG1 are respectively delivered through inverter circuits. On this occasion, if the signal is at the low level, the control signal PRG0 corresponding to the side of the memory area M0 is unconditionally formed.

A control signal for instructing the operations of sense amplifiers is formed by a NOR gate circuit G12. When the signal EPM is set at the high level, or when a signal ROMS is set at the high level with a signal R rendered the low level, the NOR gate circuit G12 brings its output signal to the low level so as to instruct the operations of the sense amplifiers. This signal is input to a NOR gate circuit G19 or G20, together with an output signal obtained by inverting the output signal of the NAND gate circuit G11 by means of one inverter circuit or two inverter circuits. The control signals SA0 and SA1 for activating the sense amplifiers are respectively provided from the outputs of the NOR gate circuits G19 and G20.

The control signal D0 for instructing the operations of the data input/output circuits is formed by a NAND gate circuit G21. One input of this NAND gate circuit G21 is supplied with the output signal of a NAND gate circuit G13 which receives the signal ROMS, the signal R passed through an inverter circuit, and a signal ES. The other input of the NAND gate circuit G21 is supplied with the output signal of a NAND gate circuit G14. The inputs of this NAND gate circuit G14 are supplied with the output signals of an OR gate circuit G15 and a NAND gate circuit G16, and so on.

Figure 10:
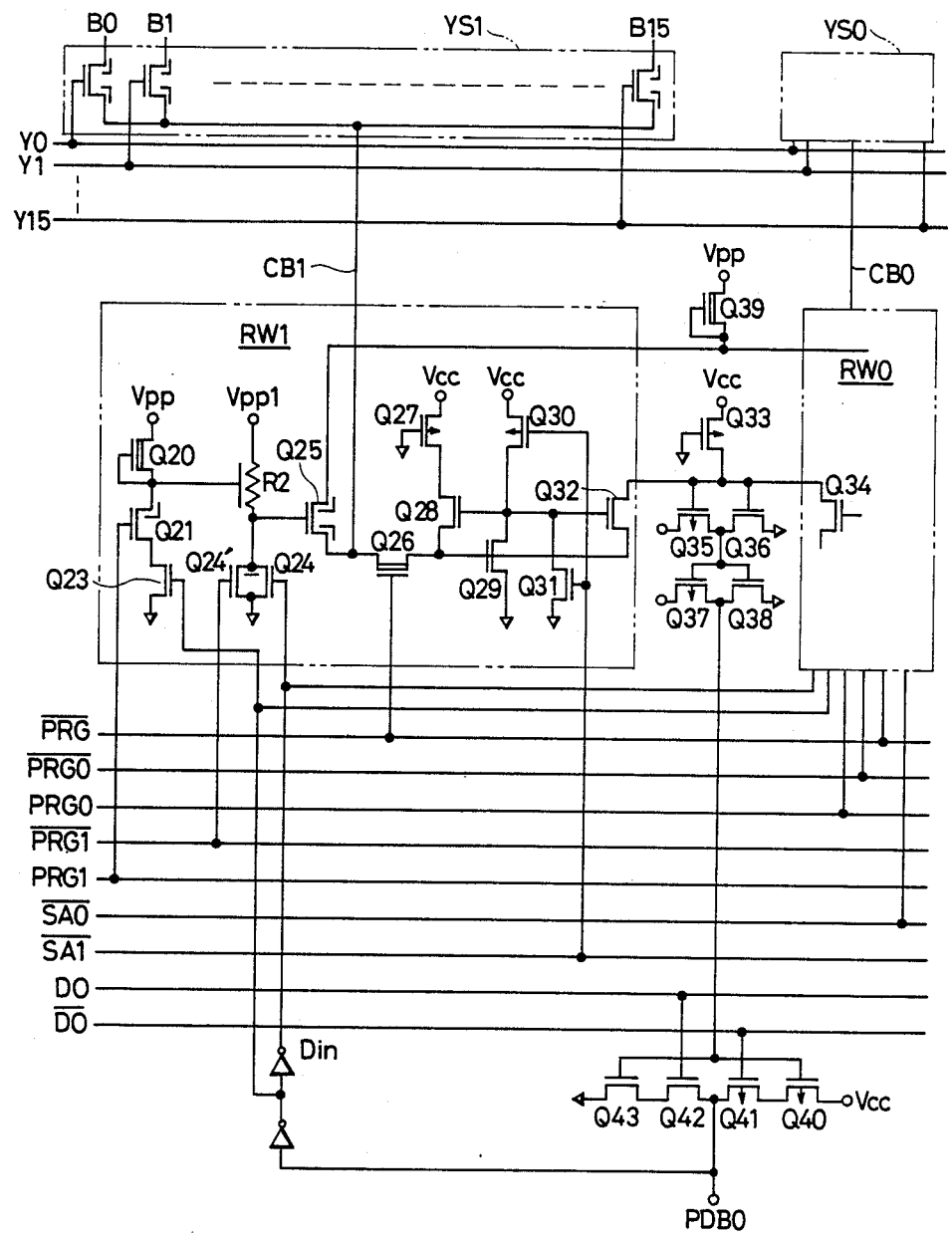
FIG. 10 is a circuit diagram showing an embodiment of a read/write circuit as well as a data input/output circuit.

Shown in FIG. 10 is a circuit diagram of an embodiment of the read/write circuit RW1 as well as the data input/output circuit DB0. In the figure, P-channel MOSFET's have arrows affixed to their channel parts (back-gate parts), thereby to be distinguished from N-channel MOSFET's.

The first-stage circuit of the sense amplifier coupled to the common bit line CB1 has amplification and level limiter functions as stated below. Stored information which has appeared on the common bit line CB1 in accordance with the addressing of a memory cell, is fed to the source of a grounded-gate amplifier MOSFET of the N-channel type Q32 through a depletion-mode MOSFET Q26 and is thus amplified by the amplifier MOSFET. A load MOSFET of the P-channel type Q33 is interposed between the drain of the amplifier MOSFET Q32 and the power source voltage $V_{cc}$. The MOSFET Q33 has its gate steadily supplied with the ground potential of the circuitry, thereby to operate as a resistance element. This load MOSFET Q33 is used as a load common to a similar amplifier MOSFET Q34 in the read/write circuit RW0. In order to heighten the sensitivity of the grounded-gate amplifier MOSFET Q32 and also to limit the signal amplitude of the common bit line CB1, there is disposed an inverting amplifier circuit which receives the signal voltage from the common bit line CB1 and which is configured of an N-channel type driver MOSFET Q29 and a P-channel type load MOSFET Q30. The output voltage of this inverting amplifier circuit is, on one hand, supplied as the gate bias voltage of the amplifier MOSFET Q32. Thus, when the potential of the common bit line CB1 is at a comparatively low level, the output voltage of the inverting amplifier circuit is rendered comparatively high and therefore brings the amplifier MOSFET Q32 into an operating state with a comparatively high conductance. In contrast, when the potential of the common bit line CB1 is at a comparatively high level, the output voltage of the inverting amplifier circuit is rendered comparatively low and therefore brings the amplifier MOSFET Q32 into an operating state with a comparatively low conductance. Though no special restriction is meant, the drain output of this amplifier MOSFET Q32 is transmitted to the input terminals of the sense amplifier constructed of two CMOS inverter circuits connected in cascade, which are respectively composed of a P-channel MOSFET Q35 and an N-channel MOSFET Q36, and a P-channel MOSFET Q37 and an N-channel MOSFET Q38.

The output of the inverting amplifier circuit (MOSFET's Q29, Q30) is, on the other hand, supplied to the gate of an N-channel type precharge MOSFET Q28. A P-channel type MOSFET Q27 for limiting current is interposed between the drain of the precharge MOSFET Q28 and the power source voltage $V_{cc}$. The P-channel type MOSFET Q27 has its gate steadily supplied with the ground potential of the circuitry, thereby to be steadily turned "on." The precharge MOSFET Q28 executes an operation similar to that of the amplifier MOSFET Q32, thereby to limit the signal amplitude of the common bit line CB1 to a comparatively low amplitude level. In other words, the MOSFET Q28 constructs, in effect, a level limiter circuit together with the inverting amplifier circuit. The load MOSFET Q30 of the inverting amplifier circuit is supplied with a sense amplifier operation timing signal $\overline{SA1}$. An N-channel MOSFET Q31 receiving the timing signal $\overline{SA1}$ is interposed between the gates of the amplifier MOSFET Q32 and the precharge MOSFET Q28 connected in common and the ground potential point of the circuitry. In the operating state of the sense amplifier in which the sense amplifier operation timing signal $\overline{SA1}$ is rendered the low level, the load MOSFET Q30 is turned "on," and the MOSFET Q31 is turned "off."

The selected memory cell has a threshold voltage which is higher or lower relative to the word line selection level of the read mode in accordance with data written therein beforehand. In a case where the selected memory cell in the memory array M-ARY (or the dummy array DMX) has the higher threshold voltage "0," a direct current path is not formed between the common bit line CB1 and the ground point of the circuitry. In this case, the common bit line CB1 is set at a comparatively high level in accordance with the supply of currents from the precharge MOSFET Q28 and the amplifier MOSFET Q32. The current supply from the level limiter circuit is, in effect, stopped when the common bit line CB1 reaches a predetermined potential. Therefore, the high level of the common bit line CB1 is limited to the comparatively low potential.

On the other hand, in a case where the selected memory cell in the memory array M-ARY (or the dummy array DMX) has the lower threshold voltage, a direct current path is formed, for example, between the common bit line CB1 and the ground point of the circuitry while extending along the column switch MOSFET Q7, the bit line B0, the selected memory cell Q1 and the MOSFET Q10 as illustrated in FIG. 5. Therefore, the common bit line CB1 is set at the low level irrespective of the bias current supplied from the level limiter circuit. Such amplitude limitations to the high level and low level of the common bit line CB1 by the level limiter circuit bring forth the following advantage: Notwithstanding that stray capacitances limiting signal change rates exist in the common bit lines CB1, etc., the reading speed can be raised. In other words, in such a case where data items are successively read out of a plurality of memory cells, it is possible to shorten the period of time in which one level of the common bit line CB1 is changed to the other level.

Moreover, when the signal $\overline{SA1}$ is set at the high level, the MOSFET Q31 is turned "on," and the MOSFET Q30 is turned "off." Therefore, the current path for causing direct current to flow is not formed in the first-stage amplifier circuit, so that the power consumption becomes low. Besides, the amplifier MOSFET Q32 is brought into the "off" state by the "on" state of the MOSFET Q31. Therefore, when the sense amplifier of the read/write circuit RW0 corresponding to the memory area M0 is brought into the operating state in accordance with a signal $\overline{SA0}$ rendered the low level, the load MOSFET Q33 operates as the load of the read/write circuit RW0.

The output signal of the sense amplifier constructed of the CMOS inverter circuits is delivered to the external terminal PDB0 through an output buffer which is constructed of P-channel MOSFET's Q40, Q41 and N-channel MOSFET's Q42, Q43 connected in serial form. The gates of the P-channel MOSFET Q40 and the N-channel MOSFET Q43 are connected in common and are supplied with the output signal of the sense amplifier, the gate of the P-channel MOSFET Q41 is supplied with an inverted control signal $\overline{D0}$, and the gate of the N-channel MOSFET Q42 is supplied with the non-inverted control signal D0, whereby the output buffer has a tri-state output function. More specifically, when the control signal $\overline{D0}$ is set at the low level with the control signal D0 rendered the high level, the P-channel MOSFET Q41 and the N-channel MOSFET Q42 fall into "on" states, and hence, the output buffer is brought into an operating state to amplify the output signal from the sense amplifier and to deliver the amplified signal to the external terminal PDB0. If the control signal $\overline{D0}$ is at the high level with the control signal D0 being at the low level, the P-channel MOSFET Q41 and the N-channel MOSFET Q42 fall into "off" states, and the output buffer falls into a high impedance state.

A write signal fed through the external terminal PDB0 is converted into signals of the same phase as and the opposite phase to the fed signal by inverter circuits connected in cascade.

The signal of the same phase as the write signal is supplied to the gate of a MOSFET Q24. The gate of a MOSFET Q24' connected in parallel with this MOSFET Q24 is supplied with an inverted write control signal $\overline{PRG1}$. In the write mode in which the signal $\overline{PRG1}$ is rendered the low level, the MOSFET Q24' is turned "off," and the MOSFET Q24 is turned "on"/"off" in accordance with the write signal. A high resistance element R2 as stated before is interposed between the drain of the MOSFET Q24 and a high voltage terminal $V_{pp}1$. The high voltage $V_{pp}1$ is a boosted voltage formed on the basis of the high voltage $V_{pp}$.

The signal of the opposite phase to the write signal is supplied to the gate of the MOSFET Q23. The gate of a MOSFET Q21 connected in series with this MOSFET Q23 is supplied with the non-inverted write control signal PRG1. In the write mode in which the signal PRG1 is rendered the high level, the MOSFET Q21 is turned "on," and the MOSFET Q23 is turned "on"/"off" in accordance with the write signal. A depletion-mode MOSFET Q20 is interposed as a load between the drain of the MOSFET Q21 and the high voltage terminal $V_{pp}$. Thus, the drain output of the MOSFET Q21 is supplied to the gate of a P-channel MOSFET serving as the high resistance element R2.

Since the input of the MOSFET Q21 is supplied with the write signal of the opposite phase, the drain output thereof brings the resistor R2 and the MOSFET Q24 into operating states complementarily so as to convert the +5 V-based write signal into a writing high level conforming to the level of the high voltage $V_{pp}$. The level-converted signal is transmitted to the gate of a MOSFET Q25. By way of example, if the write signal is at the high level, the MOSFET Q24 falls into the "on" state, and the MOSFET Q23 falls into the "off" state. Owing to the "off" state of the MOSFET Q23, the output signal thereof is brought to the high level of, e.g., the high voltage $V_{pp}$. Therefore, the MOSFET which constructs the high resistance R2 falls into the "off" state, which renders the output signal thereof the low level in cooperation with the "on" state of the MOSFET Q24. This signal of the low level brings the MOSFET Q25 into an "off" state, so that the common bit line CB1 is not supplied with the write current under the high voltage. To the contrary, if the write signal is at the low level, the MOSFET Q24 falls into the "off" state, and the MOSFET Q23 falls into the "on" state. Owing to the "on" state of the MOSFET Q23, the output signal thereof is brought into the low level of, e.g., the ground potential of the circuitry. Therefore, the MOSFET which constructs the high resistance R2 falls into the "on" state, which renders the output signal thereof the high level of, e.g., the high voltage $V_{pp}1$ in cooperation with the "off" state of the MOSFET Q24. This signal of the high level brings the MOSFET Q25 into an "on" state, so that the common bit line CB1 is supplied with the write current from the side of the high voltage $V_{pp}$ by a depletion-mode MOSFET Q39.

In the read mode or the verify mode, the inverted control signal $\overline{PRG1}$ is set at the high level, and the non-inverted control signal PRG1 at the low level. Therefore, the MOSFET Q24' is turned "on," and the MOSFET Q21 is turned "off," so that the MOSFET Q25 has the ground potential of the circuitry applied to its gate and is brought into the "off" state. This holds true also of a case where the non-inverted signal PRG0 is set at the high level with an inverted signal rendered the low level, whereby the side of the read/write circuit RW0 is brought into an operating state, and the side of the read/write circuit RW1 is brought into a non-operating state.

Incidentally, since the drain electrode of the MOSFET Q21 and the drain and source of the MOSFET Q25 and the drain of the MOSFET Q24' and Q24 are supplied with the high voltages as stated above, they are subjected to a high with-stand voltage-treatment. This applies also to the MOSFET's which construct the column switches.

In addition, the depletion-mode MOSFET Q26 provided at the input part of the first-stage amplifier circuit of the sense amplifier has its gate supplied with the control signal $\overline{PRG}$. In the write mode in which the control signal $\overline{PRG}$ is rendered the low level, accordingly, the MOSFET Q26 falls into the "off" state, and the write circuit is disconnected from the first-stage amplifier circuit.

Functional effects which are attained by the foregoing embodiments are as follows:

(1) An EPROM which is made unerasable is provided with a storage area for a write test as configured of dummy storage elements, and a memory access to the storage area is permitted on the basis of a control signal supplied from a specified external terminal, whereby the data lines or word lines of the EPROM to be used by a user and circuit functions concerning a selection circuit for the lines can be tested by performing an operation of writing data into the dummy storage elements after the completion of a product, to achieve the effect that enhancement in reliability can be realized.

(2) As the control signal for the access to the test area, a high potential above a power source voltage as fed from an external terminal is supplied, and as an element for detecting the high potential, a MOSFET which is formed in a polycrystalline silicon layer formed on an insulator film is utilized, whereby the MOSFET of comparatively high threshold voltage and comparatively high resistance can be constructed. Thus, the external terminal fed with the high voltage and a semiconductor substrate or a well region, as well as source and drain regions formed therein, can be electrically isolated without providing any special external terminal, to achieve the effect that particular consideration for latch-up can be dispensed with.

(3) Information items of a product code, etc. are stored in a part of the storage area for the test, thereby to achieve the effects that the management of the products is facilitated and that the history etc. of the product can be easily known when a defect has occurred after shipping.

Although the invention made by the inventor has thus far been concretely described in conjunction with embodiments, it is a matter of course that this invention is not restricted to the foregoing embodiments but that it can be variously altered within a scope not departing from the purport thereof. By way of example, a control signal for accessing a memory area for a write test may well be supplied from an independent external terminal. Besides, in a case where the control signal for accessing the memory area for the test is formed in such a way that a high voltage not fed in an ordinary operation is supplied by utilizing an existing external terminal such as address terminal, the practicable arrangement of a detector circuit for the high voltage can adopt any of various aspects of performance, such as an arrangement which utilizes a parasitic MOSFET employing a field insulator film as a gate insulator film and an arrangement which employs a large number of serial MOSFET's in diode connection thereby to equivalently construct a MOSFET of high threshold voltage.

Although, in the above, the present invention has been principally described as to the case of application to a single-chip microcomputer with a built-in EPROM forming the background thereof, this invention is not restricted thereto but can be extensively utilized for various sorts of semiconductor integrated circuit devices in each of which an EPROM is built under an unerasable condition as described before.

What is claimed is:

1. A single-chip microcomputer comprising:
an internal bus;
a microprocessor coupled to the internal bus for executing information processing in according with a predetermined program;
an electrically programmable read only memory coupled to the internal bus for storing the predetermined program therein, the electrically programmable read only memory including,
   memory cell means having first memory cells for storing data constituting the predetermined program and at least one second memory cell for storing data for testing, selecting means for selecting one of either the first memory cells or the second memory cell,
   input means for providing data to be written into the memory cell means from the internal bus to the memory cell means, and
   output means for providing data to be read out from the memory cell means to the internal bus,
wherein the electrically programmable read only memory has a first operating mode in which the electrically programmable read only memory is accessed from the microprocessor, and a second operating mode in which the electrically programmable read only memory is accessed from outside of the single-chip microcomputer, and wherein the second operating mode further includes a test mode in which the selecting means only selects the second memory cell in response to a control signal;

first control means coupled to the electrically programmable read only memory for controlling whether or not the electrically programmable read only memory is to be operated in the second operating mode;

first external terminals to which address signals to be applied to the selecting means are applied in the second operating mode;

second external terminals to which data to be fed to or from the electrically programmable read only memory is applied in the second operating mode; and second control means coupled to one of the first external terminals and for discriminating whether or not the electrically programmable read only memory is to be operated in the test mode and for providing the control signal to the selecting means when the electrically programmable read only memory is to be operated in the test mode.

2. The single chip microcomputer of claim 1 further comprising:

means for sensing one a first and second externally applied voltage level;

wherein the first control means includes means for selectively controlling whether or not the electrically programmable read only memory is to be operated in the second operating mode in accordance with a sensed first externally applied voltage level.

3. The single-chip microcomputer of claim 1, wherein the single-chip microcomputer is entirely encapsulated with a plastic package.

4. The single-chip microcomputer of claim 1, wherein the first and second memory cells formed from nonvolatile storage elements made up of MOSFETs having a stacked gate structure.

5. The single-chip microcomputer of claim 1, wherein the electrically programmable read only memory includes:

a plurality of word lines and a plurality of data lines coupled to the first memory cells so that each first memory cell is coupled to one word line and one data line, the plurality of word lines being coupled to the selecting means, the plurality of data lines being selectively coupled to the input and output means in according with an operation of the selecting means; and a test word lines coupled to the selecting means and to the second memory cell; and wherein the second memory cell is coupled to one of the plurality of data lies.

6. A single-chip microcomputer according to claim 1, wherein the electrically programmable read only memory includes:

a plurality of word lines and a plurality of data lines coupled to the first memory cells so that each first memory cell is coupled to one word line and one data line, the plurality of word lines being coupled to the selecting means, the plurality of data lines being selectively coupled to the input and output means in accordance with an operation of the selecting means;

a test data line coupled to the selection means and to the second memory cell; and wherein the second memory cell is coupled to one of the plurality of word lines.

7. The single-chip microcomputer of claim 1, wherein the input means includes a write circuit which is operable in the second mode to write the data fed to the second external terminals into the memory cell means, and wherein the write circuit is operated in the test mode to write the data into the second memory cell.

8. The single-chip microcomputer of claim 7, wherein a plurality of the second memory cells are provided in the memory cell means, and wherein the data written into the plurality of the second memory cells is information constituting a product code or a product history.

9. The single-chip microcomputer of claim 1, further comprising:

a random access memory coupled to the internal bus for storing temporary data therein.

* * * * *

UNITED STATES PATENT AND TRADEMARK OFFICE
CERTIFICATE OF CORRECTION

PATENT NO. : 4,905,191

DATED : February 27, 1990

INVENTOR(S) : Masahiko Arai

It is certified that error appears in the above-identified patent and that said Letters Patent is hereby corrected as shown below:

Claim 1, column 20, line 41, "according" should be --accordance--.

Claim 2, column 21, line 22, after "one" insert --of--.

Signed and Sealed this

Twenty-third Day of April, 1991

Attest:

HARRY F. MANBECK, JR.

*Attesting Officer*  *Commissioner of Patents and Trademarks*